(12) United States Patent
Baker

(10) Patent No.: US 11,402,442 B2
(45) Date of Patent: Aug. 2, 2022

(54) MAGNETIC VALIDATION

(71) Applicant: William John Baker, Figtree (AU)

(72) Inventor: William John Baker, Figtree (AU)

( * ) Notice: Subject to any disclaimer, the term of this patent is extended or adjusted under 35 U.S.C. 154(b) by 0 days.

(21) Appl. No.: 17/223,108

(22) Filed: Apr. 6, 2021

(65) Prior Publication Data

US 2021/0311142 A1 Oct. 7, 2021

(30) Foreign Application Priority Data

Apr. 7, 2020 (AU) ................................. 2020901115

(51) Int. Cl.
  *G01R 33/10* (2006.01)
  *G01R 33/07* (2006.01)
(52) U.S. Cl.
  CPC ............ *G01R 33/10* (2013.01); *G01R 33/07* (2013.01)
(58) Field of Classification Search
  CPC ....... G01R 33/10; G01R 33/07; G01R 33/072
  See application file for complete search history.

(56) References Cited

U.S. PATENT DOCUMENTS

| | | | | |
|---|---|---|---|---|
| 4,916,392 A | * | 4/1990 | Sendeff | G01R 15/207 324/263 |
| 5,663,718 A | * | 9/1997 | Segerstrom | G01R 31/66 340/870.07 |
| 2005/0258825 A1 | * | 11/2005 | Masuda | G03B 17/02 348/E5.046 |
| 2014/0145710 A1 | * | 5/2014 | Noback | G01R 35/007 324/202 |
| 2019/0011591 A1 | * | 1/2019 | Takahashi | G01R 33/038 |

* cited by examiner

*Primary Examiner* — Alvaro E Fortich
(74) *Attorney, Agent, or Firm* — Armstrong Teasdale LLP

(57) ABSTRACT

An apparatus for validating magnets on site, including a standard reference magnet for providing a governing reference, a reference magnet for providing a reference based on the governing reference, a gauss meter, a hall probe, and a scanner. The reference magnet is arranged to be taken on site for further magnetic validation and includes guide members to target a nominated magnetic field density.

8 Claims, 7 Drawing Sheets

MAGNETIC VALIDATION

This application claims priority to Australian Provisional Patent Application No. 2020901115 titled "Magnetic Validation," filed on Apr. 7, 2020, the entire contents of which are hereby incorporated herein by reference.

TECHNICAL FIELD

The present invention generally relates to a Calibrated Instrument Kit and System to enable virtual, off site validations of a magnet's strength.

BACKGROUND ART

Each document, reference, patent application or patent cited in this text is expressly incorporated herein in their entirety by reference, which means that it should be read and considered by the reader as part of this text. That the document, reference, patent application, or patent cited in this text is not repeated in this text is merely for reasons of conciseness.

In the food processing industry, food must pass through machinery, devices and assemblies to be processed. This poses a risk of metallic contamination to the food. Magnetic separators are used to pull metal fragments from the food as it passes through the machinery, devices or assemblies. These magnets must be checked at regular intervals to ensure their magnetic fields maintain sufficient strength. Currently gaussmeters are provided which have only been checked against a laboratory Standard Reference Magnet in the laboratory immediately before the technician goes to site. A trained technician must go to site, carry out measurements, analyse the results of the measurements and make a decision based on the analysis regarding the certification of the magnet/s being tested. This is an expensive and labour intensive exercise that requires the qualified technician and at least one on site person to be occupied.

Reference to cited material or information contained in the text should not be understood as a concession that the material or information was part of the common general knowledge or was known in Australia or any other country.

SUMMARY OF INVENTION

It is an object of this invention to provide to ameliorate, mitigate or overcome, at least one disadvantage of the prior art, or which will at least provide the public with a practical choice.

In a first embodiment, the present invention seeks to provide an apparatus for validating magnets on site, including a standard reference magnet for providing a governing reference, a reference magnet for providing a reference based on the governing reference a gauss meter a hall probe and a scanner; wherein the reference magnet is arranged to be taken on site for further magnetic validation; wherein the reference magnet includes guide members to target a nominated magnetic field density.

Preferably, the apparatus includes a magnetically shielded case.

Preferably, the guide members are brass sleeves.

Preferably, the scanner takes readings of the position of the hall probe and the magnetic field reading.

Preferably, the scanner is a camera.

In a second embodiment, the present invention seeks to provide a method of validating magnets on site, including calibrating a reference magnet for providing a reference, taking the reference magnet on site, aligning a hall probe to a desired position taking a scan of the position of the hall probe and the magnetic field density reading with a scanner; sending the scan externally for validation, when validated use the hall probe to validate magnetic fields.

Preferably, guide members on the reference magnet are used to align the hall probe over the desired location.

Preferably, a gaussmeter is used to show the magnetic field density reading.

BRIEF DESCRIPTION OF THE DRAWINGS

Further features of the present invention are more fully described in the following description of several non-limiting embodiments thereof. This description is included solely for the purposes of exemplifying the present invention. It should not be understood as a restriction on the broad summary, disclosure or description of the invention as set out above. The description will be made with reference to the accompanying drawings in which.

In the drawings like structures are referred to by like numerals throughout the several views. The drawings shown are not necessarily to scale, with emphasis instead generally being placed upon illustrating the principles of the present invention.

DESCRIPTION OF EMBODIMENTS

Figure 1:
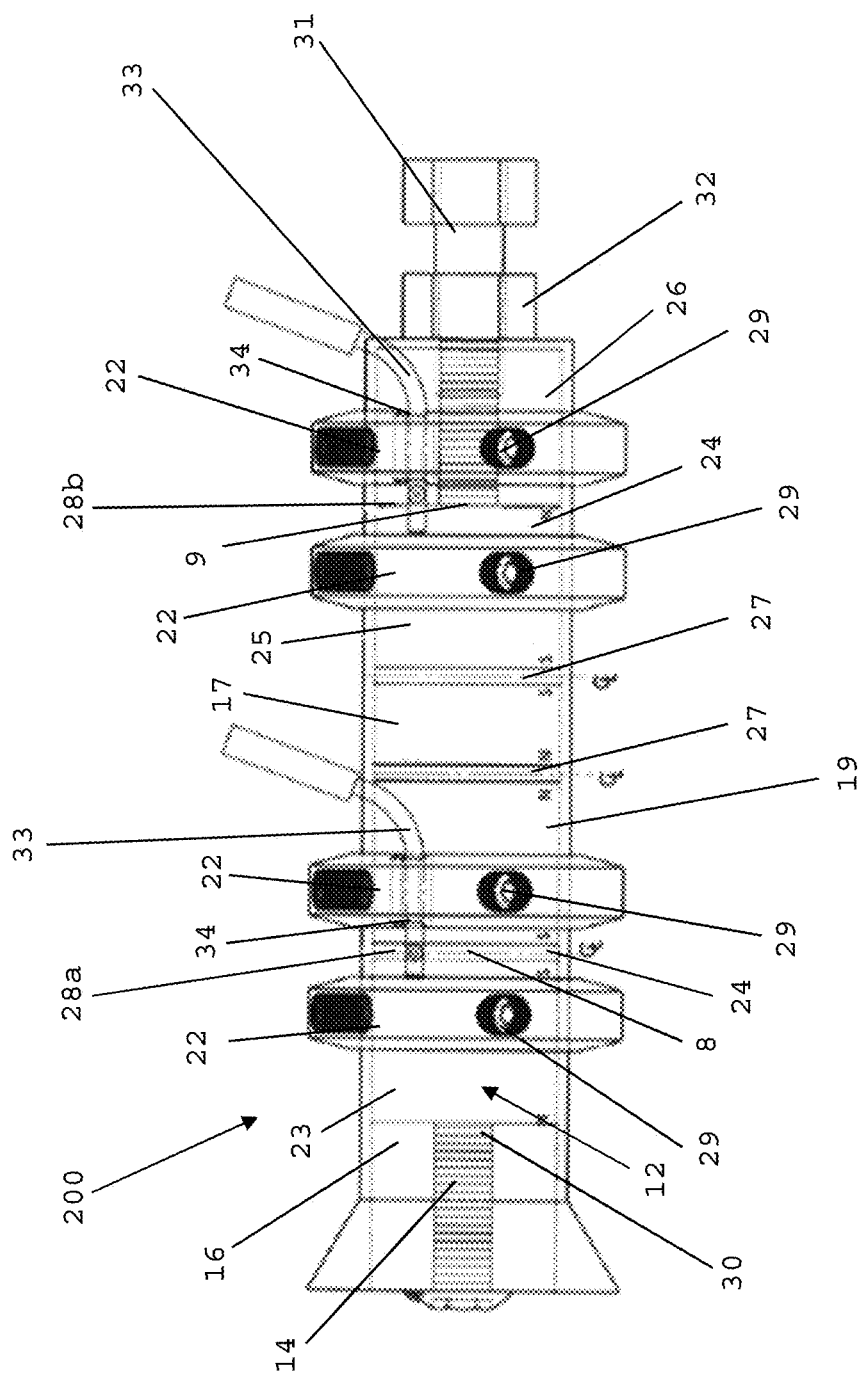
FIG. 1 is a cross sectional view of a reference magnet in accordance with an embodiment of the present invention.
Figure 2:
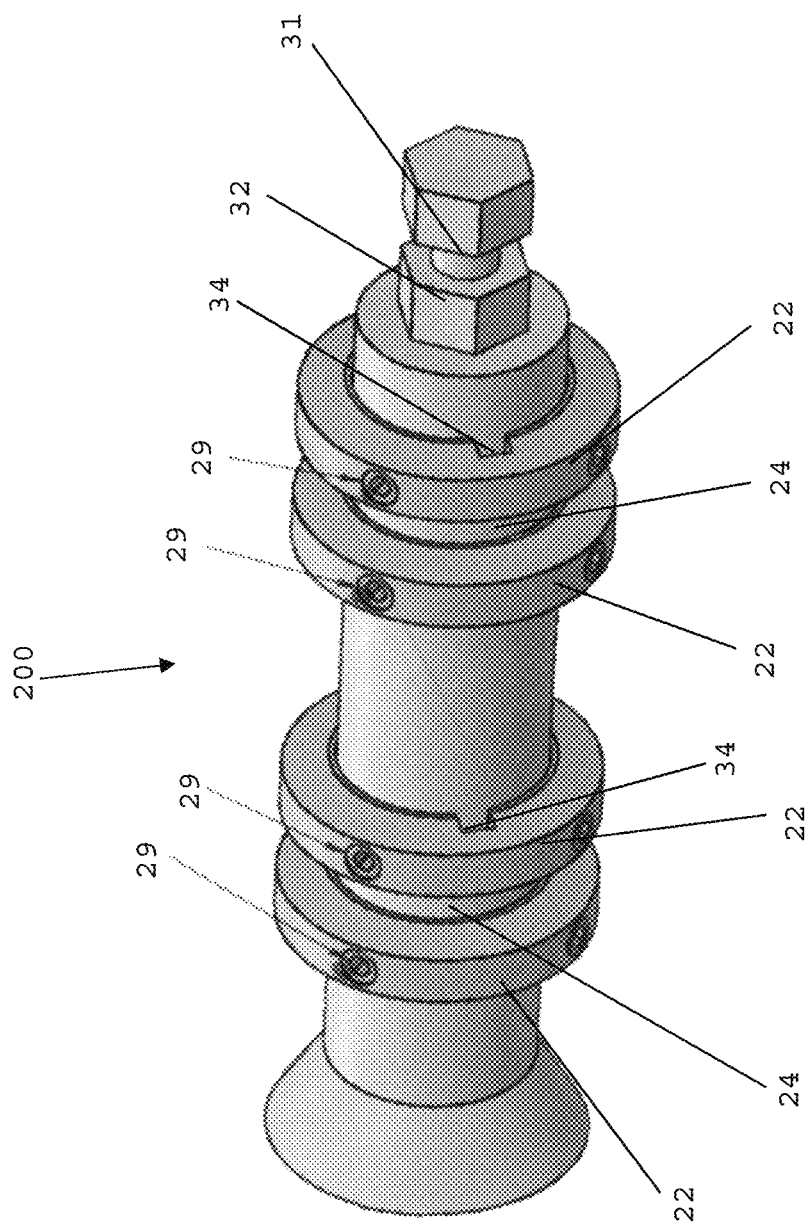
FIG. 2 is a is a perspective view of the reference magnet of FIG. 1.

Broadly, the present invention relates to systems and devices for Virtual Magnet Validation. The system and devices allow a customer themselves, anywhere in the world, to test a calibrated gauss meter on a calibrated reference magnet 200 under the guidance of an authorised technician mentor who trains the site operator to use the gauss meter on the reference magnet correctly, enabling the site operator to proceed to test the site installed magnets with confidence. The client is able to receive a calibrated instrument kit containing a type 2 calibrated reference magnet 200 and usually a currently calibrated reference gauss meter and then contacts the authorized technician mentor before commencement of site magnet testing.

The authorized technician mentor is themself experienced in magnet validations and holds a certificate of competency from the reporting consultant's laboratory. Additional to printed and pictorial instructions provided with the Instrument Kit, training includes video, live demonstration or both followed by the approval by the trainer of the users calibrated gauss meter achievement at least on the known 10000 gauss range value of the calibrated reference magnet 200. This is also to eliminate any uncertainty that damage may have occurred to the gauss meter since pre-calibration adjustment, during transport or any significant variation or drift that could have occurred since the last calibration date of the gauss/tesla meter being used on site. On receipt by the authorized technician mentor of a digital emailed photograph of the user's achievement on the calibrated reference magnet and undertaking to complete the required information form, the authorized technician mentor issues to that person a certificate of competence. The user is then permitted to proceed with the testing of product security magnets and the authorized technician mentor undertakes, by collaboration, to mentor the user as needed and as possible, considering time zone differences, during the course of the validation of nominated food safety magnets. The system followed thereby enables the user to proceed with both confidence and competence to test the food processors own food safety magnet installations without the need of having external technicians on site.

The system and devices require a calibrated reference magnet 200. Firstly, a calibrated reference magnet 200 to be used as a standard calibrated reference magnet 200 for Laboratory use only, and secondly an identical calibrated reference magnet 200 engineered for field use as considered by the present invention.

The reference magnets 200 is constructed so that the barrel of the reference magnet 200 has fixed internal magnets and micro movable measuring positions on the external surface of the barrel.

In an alternative embodiment, the barrel of the standard reference magnet has internal micro movable magnets and fixed external measuring points as discussed further below.

Current testing practice requires technicians to travel to site with a calibrated gaussmeter with calibration currency and requires for certification the inclusion in the report of a photograph of each magnet tested and of its relevant location with five gauss meter readings taken on each magnet assembly and recorded in the report.

This practice is still necessary for the present invention, but with the added requirement that the magnet photograph verifies the 5th instrument reading value on each magnet set tested showing the hall probe still on the magnet and the photograph number is identified along with other necessary details on a disclosed Virtual Magnet Validation Information Document. Experienced food safety personnel and magnetic separation consultants then assess the information and write up any specifications to cover needed magnet upgrades. The report is compiled for endorsement and inclusion of certificates and other information considered to be useful in metal fragment control endeavors.

Figure 3:
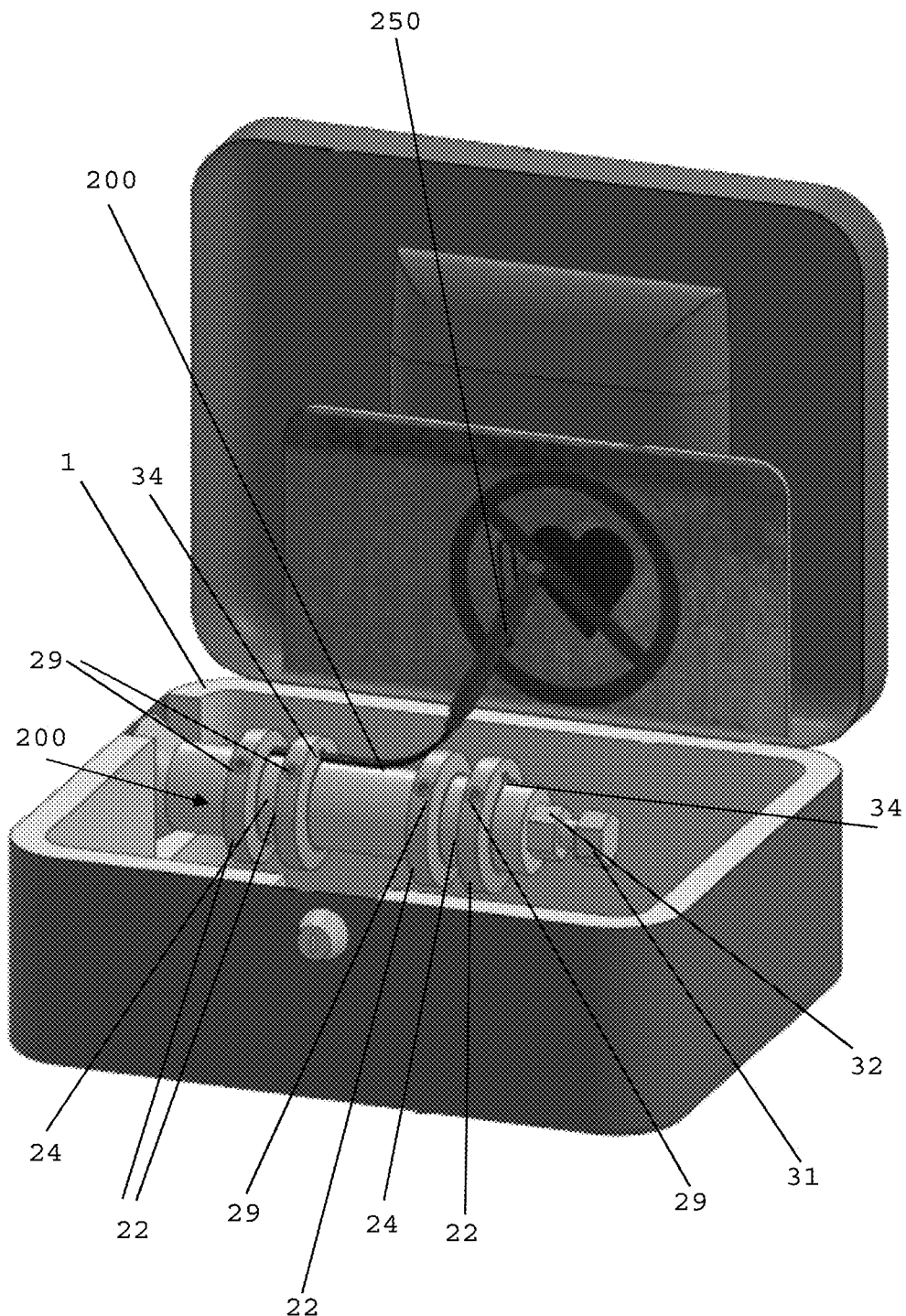
FIG. 3 is a perspective view of a kit using the reference magnet of FIG. 1.
Figure 4:
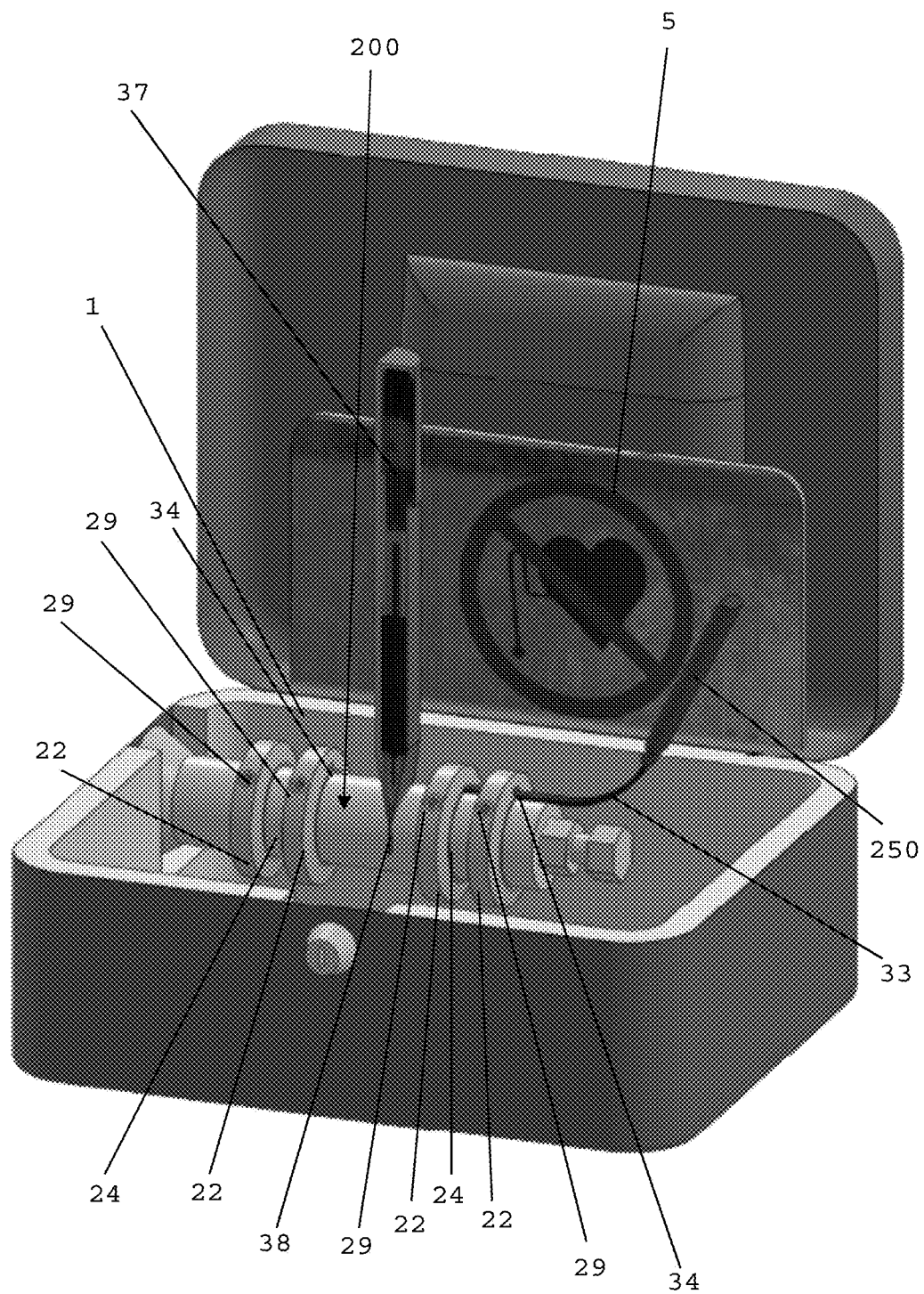
FIG. 4 is a perspective view of a kit using the reference magnet of FIG. 1.

With reference to FIGS. 1 to 4, the calibrated reference magnet 200 of the present invention is shown that can be used as a standard calibrated reference magnet 200 for Laboratory use only, and secondly as a calibrated reference magnet 200 engineered for field use. A calibrated reference kit as shown in FIGS. 3 and 4 has been developed for field usage wherein calibrated reference magnet 200 is bolted to the side of the described steel case 1 using a mounting bolt.

FIG. 1 shows the method for taking confirmatory readings on the calibrated reference magnet 200 at the 4000 and 10,000 gauss range test points 28a, 28b. At the 4000 and 10,000 gauss positions 28a, 28b a slot 34 in the base of the end-most collar 22 guides the hall probe 33 axially till it stops at the second collar 22. The gap 24 enables a visual confirmation that the probe has reached the measuring position.

FIG. 1 discloses the inner magnetic circuit of the type 2 calibrated reference Magnet 200, all the inner magnet components, fixed cylindrical magnets 17, 19, 23,25 and ferromagnetic pole spacers 27 may all be both mechanically and chemically fixed within barrel 12 for shock resistance and magnetic durability in site usage. To tighten repelling magnets together prior to fixing, grub screw 30, bolt 31 and lock nut 32 are employed. Movable External non-magnetic collars 22 are mounted on the outside of the instrument barrel 12 either side of external measurement points 8 and 9 which have been adjusted before fixing to provide measurement verification points 8 and 9 on the outside of barrel 12 which are in excess of the desired 10000 and 4000 gauss values at said measurement reference points 8 and 9. In this case the pre calibration gauss at said measurement points is adjusted by micro moving the external collars 22, or more precisely, the gaps 24 between the collars to one side of the fixed measurement points 8 and 9. Point 8 is directly over centreline 28a of ferromagnetic pole plate 27 between magnets 19 and 23. Point 9 is directly over centreline 28b of ferromagnetic pole plate 27 capping north pole of magnet 25. Each of the movable collars 22 has 2 smooth end grubscrews 29 to enable adjusting and fixing of the collars 22 at calibration positions. Minor adjustments prior to calibration may be made by loosening blunted grub screws and changing the centreline of the gap in relation to the pole junctions 28a and 28b of inner fixed magnets. All adjustments in both dispositions are sealed with red paint after calibration in order to be tamper evident.

FIG. 3 show the position of the Calibrated Reference magnet 200 in the case 1 and correct methods of taking confirmatory measurements on the 10,000 gauss range test point. As disclosed in the figure, confirmation measurements of the gauss meter on the reference magnet at the 10,000 gauss range point is verified reliably by placing the hall probe 33 of the gauss meter 250 through slot 34 along the longitudinal extension of instrument barrel 12 and across the gap 24 between the position governing collars 22.

FIG. 4 show the position of the calibrated reference magnet 200 in the case 1 and correct methods of taking confirmatory measurements on the 4000 gauss range test points. As illustrated in the kit for site use, confirmation measurements of the gauss meter on the reference magnet at the 4000 gauss range point is verified reliably by placing the hall probe 33 of the gauss meter 250 through slot 34 along the longitudinal extension of instrument barrel 12 and across the gap 24 between the position governing collars 22.

FIG. 4 also shows magnetic safety marking pen 37 is included in the kit to accurately mark the positions 38 on bar type magnets to be tested over high strength pole junctions of inner magnets of the customer magnets to be validated. The pen 37 having a magnetic end automatically finds and marks the correct positions to measure with the calibrated reference magnet 200; assisting in the practicability of the system. Positions 27 at centre of the apparatus of FIG. 1 are 2 different strengths and are provided for training purpose in the use of the marker pen to locate them and then read them with gauss meter as depicting site magnets to be tested.

The Calibrated reference magnet 200 is bolted to the side or base of the steel container 1 and arranged so no high strength part of the reference magnet contacts the steel container 1 in transport or in use.

FIGS. 3 and 4 show steel container 1 within which, in one embodiment, the Calibrated gaussmeter 250 and hall probe 33 is packed alongside the calibrated reference magnet 200 with magnetic steel protecting shield between them protecting the gaussmeter from constant contact with high strength magnets in transit and storage which could damage the gauss/tesla meter. During field use the Shield 5 is lifted out and placed for convenience on a magnetic strip attached to inside of the lid of the steel container.

In an alternative embodiment, a standard calibrated reference magnet 100 with internal micro movable magnets and fixed external measuring points is used in place of the calibration reference magnet 200. It is to be understood that the calibration reference magnet can be used in place of the standard calibrated reference magnet and features common between the two magnets have been given the same reference numbers to reflect this.

Figure 5:
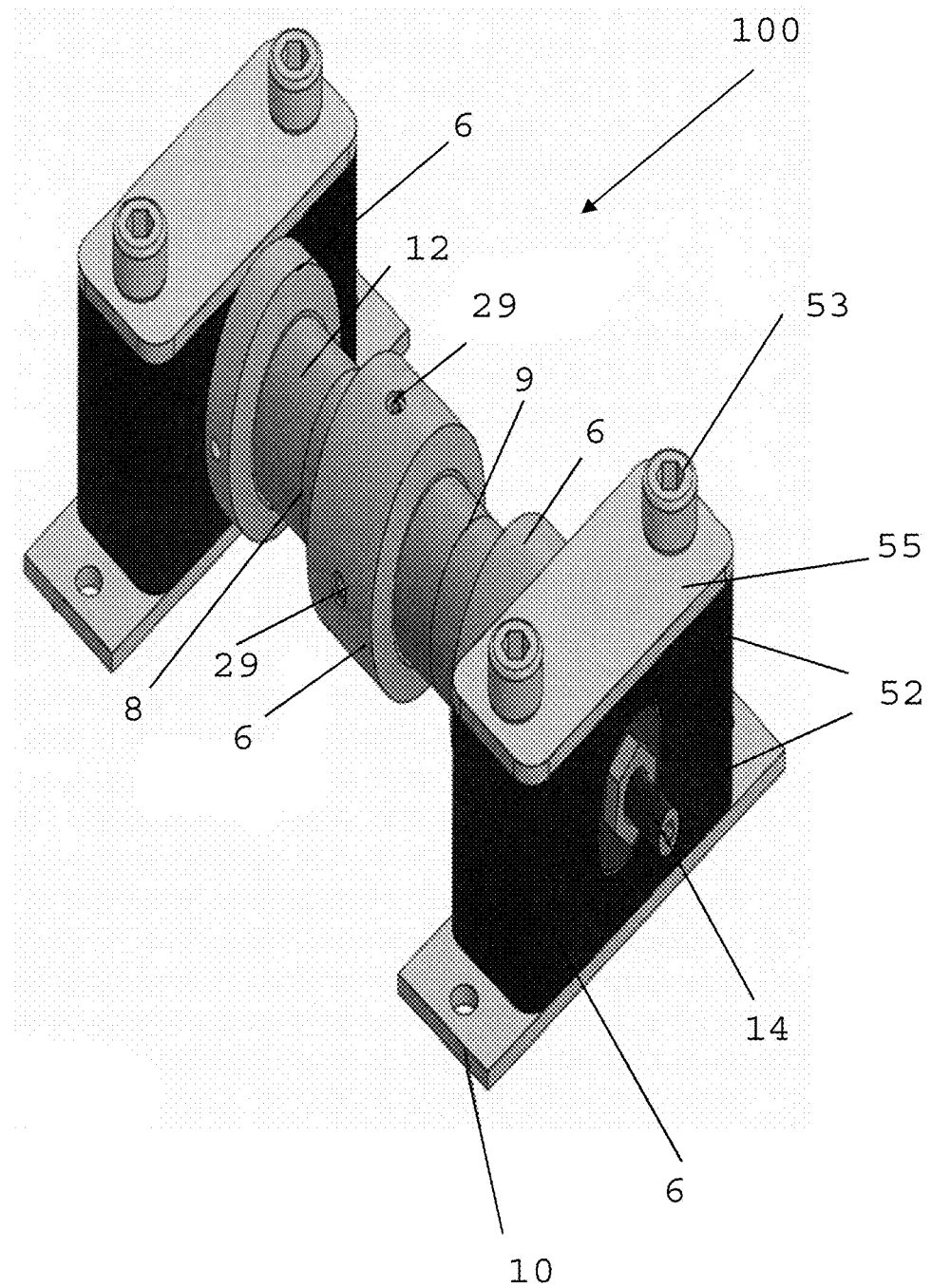
FIG. 5 is a perspective view of a reference magnet in accordance with a further embodiment of the present invention.
Figure 6:
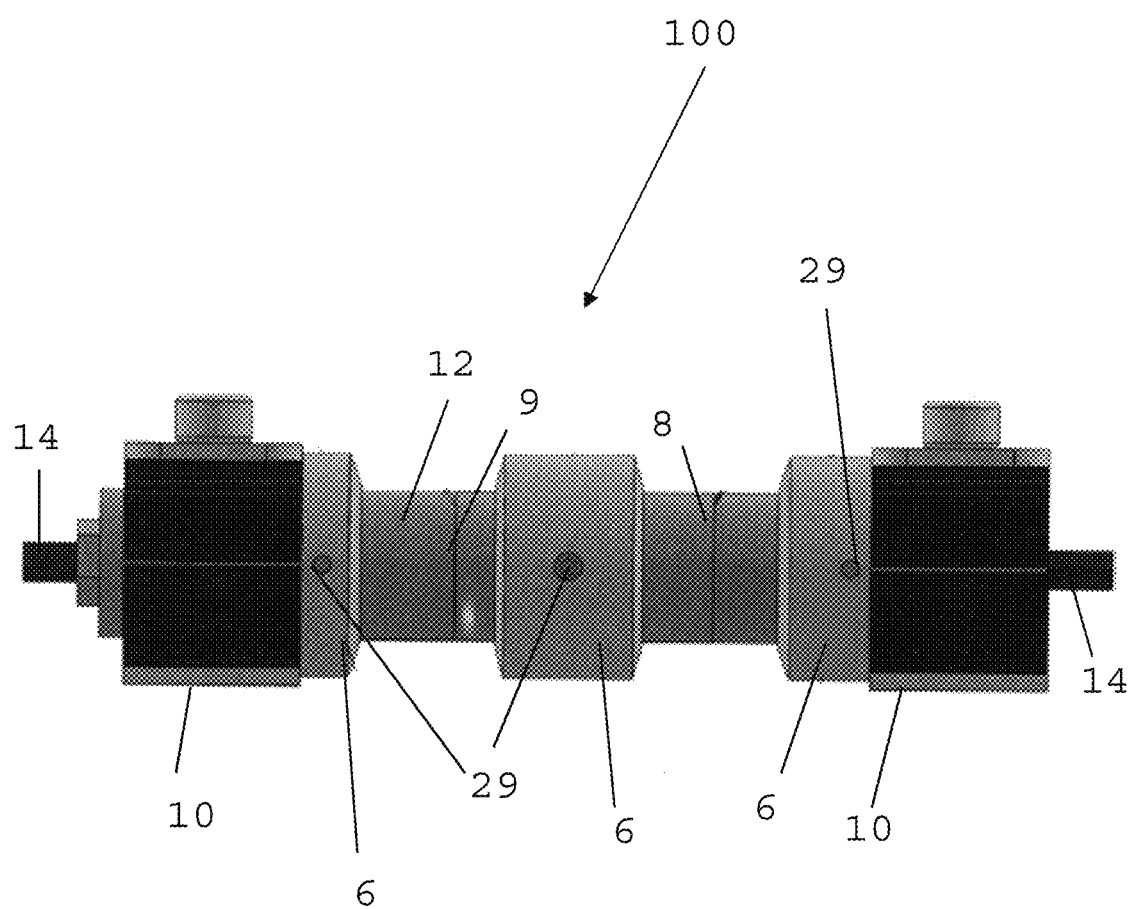
FIG. 6 is a side view of the reference magnet of FIG. 5.
Figure 7:
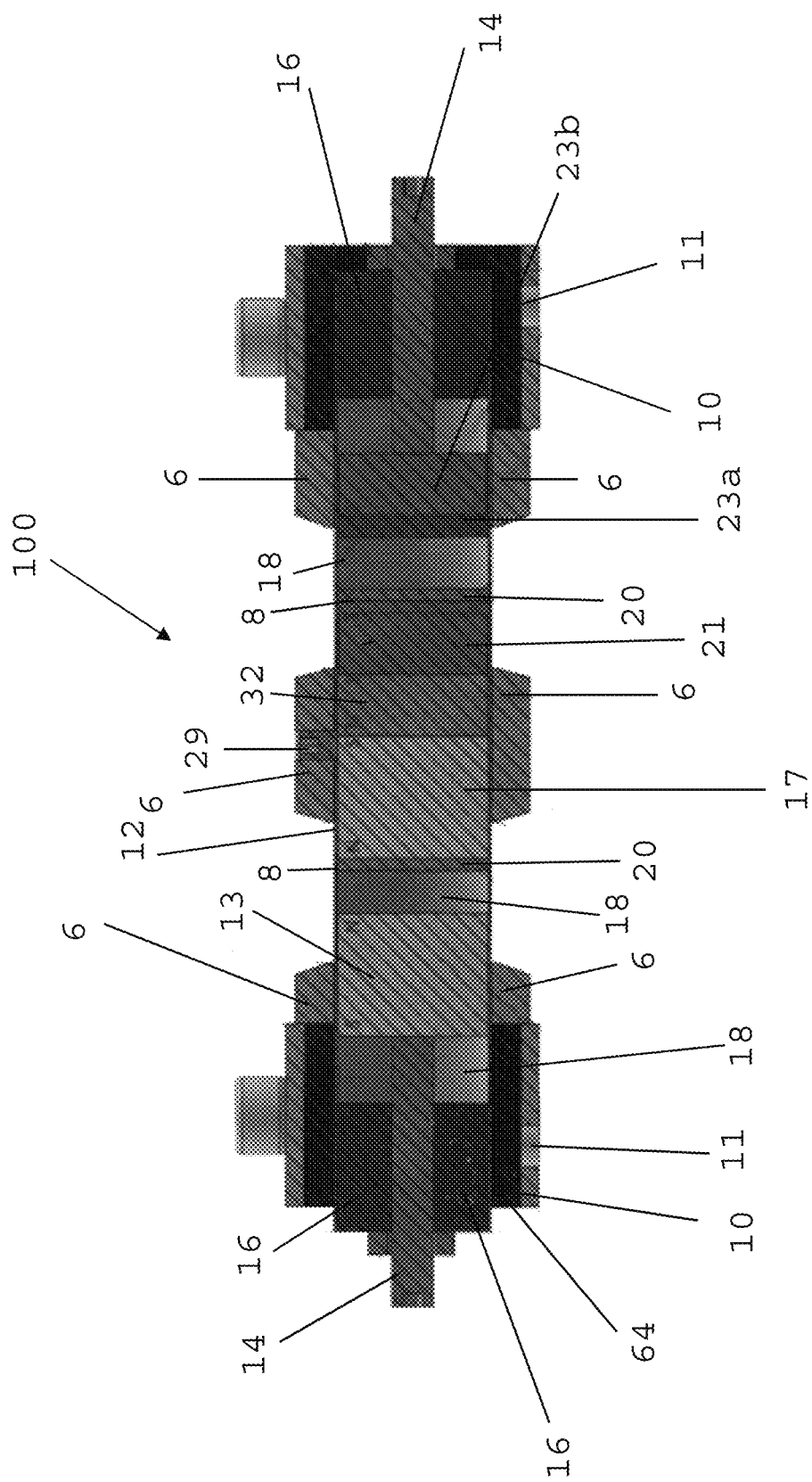
FIG. 7 is a cross sectional view of the reference magnet of FIG. 5.

Referring to FIGS. 5 to 7, the invention according to the first embodiment includes a reference magnet 100 in a kit for virtual testing of magnets.

The inner magnet arrangement of Standard Reference magnet 100 and adjustment of its inner movable magnet slugs to provide the 10000 gauss and 4000 gauss test points 8 and 9 is shown. A cylindrical magnet 17 in one longer length, or as shown, comprising and extension magnet 32 is fixed approximately centrally within a non-magnetic instrument barrel 12 and is permanently capped at its north pole with a ferromagnetic end plate 20. Movable like pole cylindrical inner magnet 13 is micro slidable away from or towards fixed cylindrical magnet 17. The gap 18 between said fixed and movable magnets is varied minutely by means of radial adjustment screws 14 through threaded holes in end plugs 16 or by a fine thread on the inner surface of instrument barrel 12 and the outer surface of end plugs 16. This generates a fixed measuring point 8 directly above the ferromagnetic end plate 20 on the corresponding outside surface of instrument barrel 12 This reference point 8 can be set to verify for example 10000 gauss prior to National calibration. Should a lower range be needed as well, a fixed spacer 21 of nonmagnetic material is abutted to the fixed extension magnet 32. The non-magnetic spacer 21 is abutted to magnet 32 which adds to the strength of magnet 17 being of unlike poles. A similar set of smaller volume cylindrical magnets 23a and 23b are thereby sufficiently distanced from the larger magnet 17 to avoid its influence. Spacer 21 is fixedly attached to the central magnetic assembly. The smaller magnet 23a, adjacent the spacer 21 is also fixed thereto along with its ferro-magnetic cap plate 20. A repelling magnet 23b adjusting the gap 24 between the two smaller magnets 23a and 23b to generate, for example, a 4000 gauss range external fixed test point 9 on the corresponding outside surface of barrel 12. Both desired reference point values are adjusted in this way prior to locking and calibration by the national measurement authority. The Calibrated Standard Reference Magnet 100 includes clamps 10 and bolts 11, for storage, transport and protection of the Calibrated Standard Reference Magnet 100 and a calibrated Standard Gaussmeter 250 and hall probe 33. Both instruments are to be calibrated and certified by National measurement Institute of Australia or equivalent authorising body that can enact standards.

The Calibrated Standard Reference Magnet 100 is transported in a shielded case and is bolted to the base of carry and transport case 1 with clamps 10 and bolts 11 allowing space, for storage, transport and protection of a calibrated Standard Gaussmeter 150. Both instruments are to be calibrated and certified by National measurement Institute of Australia or equivalent authorising body that can enact standards. The Standard Reference Magnet 100 is manufactured to provide accuracy in the range 4000 gauss to 10000 gauss with calculated uncertainties and an accurate range tolerance of plus or minus 5%. A 10000 gauss or 1 tesla fixed test point 8 and a 4000 gauss or .4 tesla fixed test point 9, is provided to ensure the Standard gauss or tesla meter is accurate at both ranges for laboratory calibration of similar type 2 field instruments. A steel protector shield is provided as apart of the case which holds magnetically against brass collars 6 on the instrument barrel to retain strong stray fields radiating from the inner magnets 13,17,22,23 within non-magnetic stainless-steel instrument barrel 12 of Standard Reference Magnet 100 when fitted within the carry and transport case 1. The steel protector shield 5 is designed to prevent adverse effect of such stray fields which may otherwise damage the gaussmeter during periods of laboratory storage. Inner workings of Standard Reference Magnet 100 (type 1) of this invention are disclosed in FIGS. 5, 6 and 7.

The inner magnet arrangement of Standard Reference magnet 100 and adjustment of its inner movable magnet slugs to provide the 10000 gauss and 4000 gauss test points 8 and 9 is shown. A cylindrical magnet 17 is fixed approximately centrally within a non-magnetic instrument barrel 12 and is permanently capped at its north pole with a ferromagnetic end plate 20. Movable like pole cylindrical inner magnet 13 is slidable away from or towards fixed cylindrical magnet 17. The gap 18 between the fixed and movable magnets is varied minutely in the range of + or −1 mm by means of radial adjustment screws 14 through threaded holes 15 in end plugs 16 or by a fine thread on the inner surface of instrument barrel 12 and the outer surface of end plug 16. This generates a fixed measuring point 8 directly above the ferromagnetic end plate 20 on the corresponding outside surface of instrument barrel 12 This reference point 8 can be set to verify for example 10000 gauss prior to National calibration. Should a lower range be needed as well, a fixed spacer 21 of nonmagnetic material is abutted to the fixed magnet 17 and a similar set of smaller volume cylindrical magnets 23a and 23b is thereby sufficiently distanced from the larger magnet 13 to avoid its influence. The smaller magnet 22 abutting the spacer 21 is also fixed and has a like ferro-magnetic cap plate 20 and a repelling magnet 23b adjusting the gap 24 between the two smaller magnets 23a and 23b to generate for example a 4000 gauss range external fixed test point 9 on the corresponding outside surface of barrel 12. Both desired reference point values are adjusted in this way prior to locking and calibration by the national measurement authority.

Modifications and variations such as would be apparent to the skilled addressee are considered to fall within the scope of the present invention. The present invention is not to be limited in scope by any of the specific embodiments described herein. These embodiments are intended for the purpose of exemplification only. Functionally equivalent products, formulations and methods are clearly within the scope of the invention as described herein.

Reference to positional descriptions, such as lower and upper, are to be taken in context of the embodiments depicted in the figures, and are not to be taken as limiting the invention to the literal interpretation of the term but rather as would be understood by the skilled addressee.

Throughout this specification, unless the context requires otherwise, the word "comprise" or variations such as "comprises" or "comprising", will be understood to imply the inclusion of a stated integer or group of integers but not the exclusion of any other integer or group of integers.

The invention claimed is:

1. An apparatus for validating magnets on site, including a standard reference magnet for providing a governing reference; a reference magnet for providing a reference based on the governing reference; a gauss meter; a hall probe; and a scanner; wherein the reference magnet is arranged to be taken on site for further magnetic validation; and wherein the reference magnet includes guide members to target a nominated magnetic field density.

2. The apparatus of claim 1, further comprising a magnetically shielded case.

3. The apparatus of claim 1, wherein the guide members are brass sleeves.

4. The apparatus of claim 1, wherein the scanner takes readings of a position of the hall probe and the magnetic field density.

5. The apparatus of claim 1, wherein the scanner is a camera.

6. A method of validating magnets on site, the method comprising: calibrating a reference magnet for providing a reference; taking or sending the reference magnet on site; aligning a hall probe to a desired position; taking a scan of the position of the hall probe and a magnetic field density reading with a scanner; sending the scan externally for validation; and using the hall probe to validate magnetic fields when externally validated.

7. The method of claim 6, wherein guide members on the reference magnet are used to align the hall probe over the desired location.

8. The method of claim 6, further comprising using a gaussmeter to show the magnetic field density reading.

\* \* \* \* \*